United States Patent [19]

Vojak et al.

[11] Patent Number: 4,791,648
[45] Date of Patent: Dec. 13, 1988

[54] LASER HAVING A SUBSTANTIALLY PLANAR WAVEGUIDE

[75] Inventors: Bruce A. Vojak, Naperville, Ill.; Sang K. Sheem, Pleasanton, Calif.

[73] Assignee: Amoco Corporation, Chicago, Ill.

[21] Appl. No.: 10,643

[22] Filed: Feb. 4, 1987

[51] Int. Cl.$^4$ ............................................. H01S 3/19
[52] U.S. Cl. ......................................... 372/46; 372/45; 372/50
[58] Field of Search ...................... 372/43, 45, 46, 64, 372/50, 44

[56] References Cited

U.S. PATENT DOCUMENTS 4,594,718  6/1986  Scifres et al. .................... 372/45

Primary Examiner—William L. Sikes
Assistant Examiner—Georgia Y. Epps
Attorney, Agent, or Firm—Richard A. Kretchmer; William H. Magidson; Ralph C. Medhurst

[57] ABSTRACT

A laser which contains a substantially planar waveguide wherein the waveguide along the direction of light propagation is comprised of varying combinations of high-gain and low-gain regions so that the cumulative gain from one end of the optical cavity to the other varies as a function of position along a line within the plane of said waveguide which is perpendicular to the direction of light propagation.

20 Claims, 1 Drawing Sheet

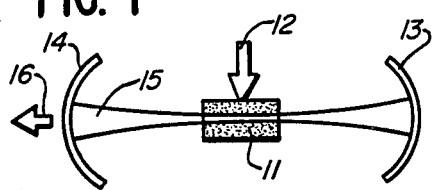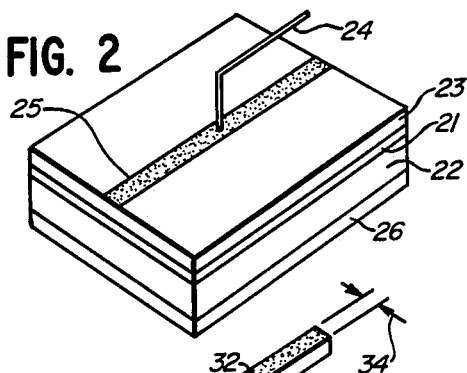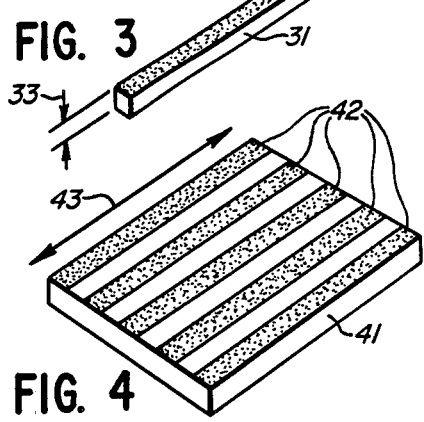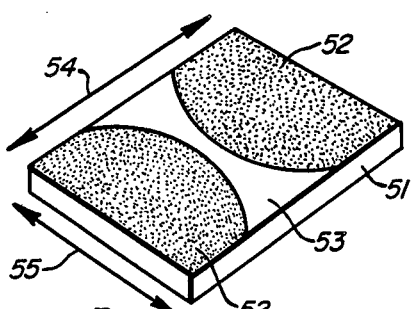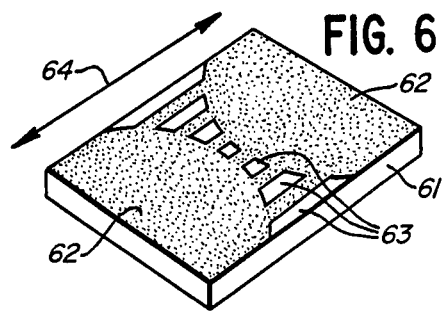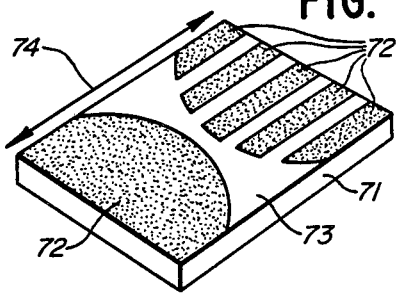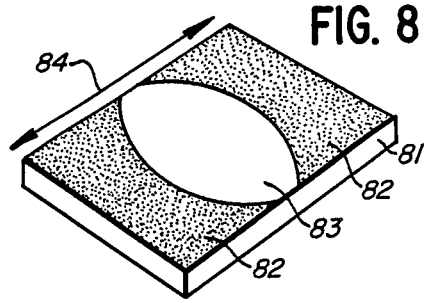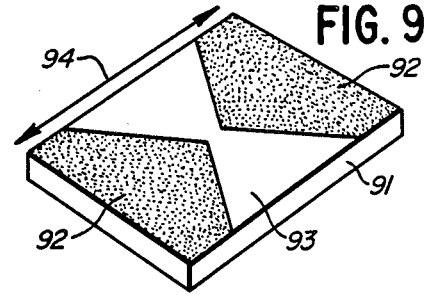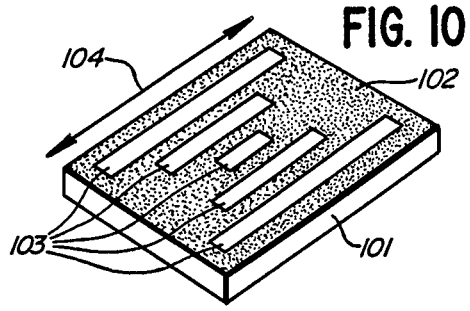

LASER HAVING A SUBSTANTIALLY PLANAR WAVEGUIDE

BACKGROUND OF THE INVENTION

1. Field of the Invention

This invention relates to a laser which contains a substantially planar waveguide. More particularly, it relates to such a laser wherein the waveguide along the direction of laser light propagation is comprised of varying combinations of high-gain and low-gain regions.

2. Description of the Prior Art

A laser is a device which has the ability to produce monochromatic, coherent light through the stimulated emission of photons from atoms or molecules of an active medium which have been excited from a ground state to a higher energy level by an input of energy. Such a device contains an optical cavity or resonator which is defined by highly reflecting surfaces which form a closed round trip path for light, and the active medium is contained within the optical cavity.

If a population inversion is created by excitation of the active medium, the spontaneous emission of a photon from an excited atom, molecule or ion returning to its ground state can stimulate the emission of photons of identical energy from other excited atoms, molecules or ions. As a consequence, the initial photon creates a cascade of photons between the reflecting surfaces of the optical cavity which are of identical energy and exactly in phase. A portion of this cascade of photons is then discharged through one or more of the reflecting surfaces of the optical cavity.

Excitation of the active medium of a laser can be accomplished by a variety of methods. However, the most common methods are optical pumping, use of an electrical discharge, and the passage of an electric current through the p-n junction of a semiconductor laser.

Semiconductor lasers contain a p-n junction which forms a diode, and this junction functions as the active medium of the laser. Such devices, which are also referred to as laser diodes, are typically constructed from materials such as gallium arsenide and aluminum gallium arsenide alloys. The efficiency of such lasers in converting electrical power to output radiation is relatively high and, for example, can be in excess of 40 percent.

Laser diodes ordinarily contain a waveguide which serves to confine the laser light to a specific region within the optical cavity. This waveguide can be either a gain-guided structure or an index-guided structure. The gain-guided structure is formed temporarily during injection of pumping current into the laser diode and is believed to result, at least in part, from formation of a thermally induced refractive index gradient within the active layer and cladding layers during operation of the device. On the other hand, index-guided structures contain a built-in refractive index profile which is parallel to the p-n junction and serves to confine the light in a region parallel to the junction.

A stripe geometry is conventional for the waveguide of a laser diode where the width of the waveguide is comparable to the wavelength of the laser light. With such a geometry, lowest order or fundamental lateral mode operation can be achieved. However, it has been recognized that an increased amount of output radiation can be obtained through the use of a broad and substantially planar or so-called slab waveguide. Such a slab waveguide has a width which is typically tens of times larger than that of the stripe waveguide and, accordingly, can contain a larger volume of active material and afford a higher output power at reduced current and power densities.

Unfortunately, the use of a slab waveguide carries with it an undesirable loss of lateral mode control. Since the width of the slab waveguide is large enough to support a multitude of lateral modes, the output beam from the laser has a profile along the width of the waveguide which is very irregular, and this profile can change with both time and pumping level. The output beam profile from such a slab waveguide is also a function of any minute defects and inhomogeneities. These defects and inhomogeneities result in filamentation, a phenomenon wherein portions of the active region act quasi-independently of each other to afford a near field pattern which consists of bright filaments in a limited area rather than a smooth intensity distribution across the width of the waveguide. At the present time, there is no completely satisfactory method to cure these problems without seriously complicating the laser diode fabrication procedure, which increases the device cost.

Various types of multiple-stripe lasers have been developed in an effort to overcome the problems which are associated with slab lasers. For example, the optical coupling of adjacent, parallel, stripe lasers has been described by J. E. Ripper et al., *Appl. Phys. Lett.*, 17, 371 (1970). U.S. Pat. No. 4,255,717 (Scifres) discloses a laser device which contains a plurality of adjacent stripe lasers wherein a portion of the radiation established in any one stripe is deflected and coupled into one or more of the adjacent stripes. Further, an asymmetric, offset stripe laser diode array has been described by D. F. Welch et at., *Electronics Lett.*, 21, 603 (1985). However, all of these approaches involve the coupling of single stripe lasers and do not solve the above-described problems which are associated with a slab laser.

J. Salzman et al., *Appl. Phys. Lett.*, 49, 611 (1986) have described a diode laser having a slab waveguide which possesses identical periodic perturbations as a consequence of multiple ridges extending some 10 μm in a direction normal to the facets. This laser is multifilamentary in character and produces a single lobed and nearly diffraction limited far-field pattern. However, this reference fails to suggest a laser diode having a slab waveguide which is perturbed in a manner which is not periodic in an identically repetitive manner. In addition, J. Salzman et al., *Appl. Phys. Lett.*, 46, 218 (1985), have described the fabrication and operation of a GaAs diode laser with both mirrors having a convex shape and wherein the lateral width of the gain region was defined by an 80 μm contact stripe. It is reported that this laser operated stably in a single lateral mode over a range of injection currents. However, the optical cavity of this laser did not contain a combination of high-gain and low-gain regions.

SUMMARY OF THE INVENTION

We have found that lateral mode control can be achieved in a laser having a slab waveguide by varying the combination of high-gain and low-gain regions between the reflecting surfaces of the laser's optical cavity as a function of position across the width of the waveguide. By providing a higher gain at positions where desired lateral modes inherently have a higher amplitude in terms of local lateral eigen-function profile, these desired modes can be selected from the plethora of allowable modes that could otherwise be supported by the waveguide.

One embodiment of the invention is a laser comprising an optical cavity which contains an active medium and a substantially planar waveguide to confine the laser light within a plane, wherein said waveguide is comprised of both high-gain and low-gain regions of the active medium, wherein the waveguide along the direction of laser light propagation is comprised of varying combinations of high-gain and low-gain regions so that the cumulative gain from one end of the optical cavity to the other varies as a function of position along a line within the plane of said waveguide which is perpendicular to said direction of light propagation and wherein said variation is not periodic in an identically repetitive manner, whereby some of the lateral modes of the optical cavity experience a relatively higher gain than the rest of the lateral modes of said optical cavity.

Another embodiment of the invention is a laser comprising an optical cavity which contains an active medium and a substantially planar waveguide to confine the laser light within a plane, wherein said waveguide is comprised of both high-gain and low-gain regions of the active medium, wherein the waveguide along the direction of laser light propagation is comprised of varying combinations of high-gain and low-gain regions so that the cumulative gain from one end of the optical cavity to the other varies from point to adjacent point along a line within the plane of said waveguide which is perpendicular to said direction of light propagation, wherein said points are uniformly spaced along said line at a distance not greater than 10 $\mu$m and wherein said cumulative gain varies in a nonrepetitive manner from one pair of adjacent points to the next pair of adjacent points along said line, whereby some of the lateral modes of the optical cavity experience a relatively higher gain than the rest of the lateral modes of said optical cavity.

An object of this invention is to provide an improved laser having a slab waveguide.

Another object of this invention is to provide a method for lateral mode control in the output beam of a slab laser.

Another object of this invention is to provide a waveguide of improved design for use in a laser.

Another object of this invention is to provide a slab laser with an output beam profile which is stable over a wide range of laser output power levels.

A further object of this invention is to provide a slab laser wherein lateral mode control is combined with an enhanced utilization of the active medium in the optical cavity.

A still further object of the invention is to provide an easily fabricated semiconductor slab laser whose output has a controlled lateral mode structure.

BRIEF DESCRIPTION OF THE DRAWINGS

FIG. 1 of the drawings is a schematic representation of a conventional laser.

FIG. 2 is a perspective view of a single-stripe semiconductor laser diode having a p-n junction and a built-in waveguide.

FIG. 3 is a perspective view of the waveguide portion of the laser diode set forth in FIG. 2.

FIG. 4 is a perspective view of the waveguides of a prior art multiple-stripe semiconductor laser diode.

FIG. 5 is a perspective view of the waveguide of an embodiment of this invention.

FIG. 6 is a perspective view of the waveguide of a second embodiment of this invention.

FIG. 7 is a perspective view of the waveguide of a third embodiment of this invention.

FIG. 8 is a perspective view of the waveguide of a fourth embodiment of this invention.

FIG. 9 is a perspective view of the waveguide of a fifth embodiment of this invention.

FIG. 10 is a perspective view of the waveguide of a sixth embodiment of this invention.

DETAILED DESCRIPTION OF THE PREFERRED EMBODIMENTS

The operation of a conventional laser is illustrated schematically in FIG. 1. The active medium 11 of the laser is excited by an energy source which is depicted by arrow 12. As a consequence of the resulting population inversion, active medium 11 then emits light which is confined by mirrors 13 and 14 within the optical cavity which is defined by these two mirrors. The light reflected by mirrors 13 and 14 stimulates the emission of additional light by the active medium, and the resulting cascade of photons forms a beam of light 15. The cross-section of beam 15 has certain well-defined spatial profiles called transverse modes. A particularly desirable transverse mode, the $TEM_{oo}$ mode, has a Gaussian intensity pattern across the beam diameter. One of the two mirrors, 14, is designed to partially transmit the light which is generated within the optical cavity, and the resulting output beam is depicted by arrow 16.

FIG. 2 illustrates a semiconductor laser diode. This device contains all of the elements of a conventional laser which are set forth schematically in FIG. 1. The active medium 21 is a p-n junction between an n-type semiconductor 22 and a p-type semiconductor 23. The active medium 21 is excited by an electric current that is passed through lead 24, into electrode 25, across the p-n junction 21, and into heat sink and electrical contact 26 at the base of the diode laser. The mirrors which define the laser cavity are the polished or cleaved ends of the semiconductor material itself. In addition, the diode laser has an optical waveguide located under electrode 25 which contains that portion of the active medium which is subjected to pumping during operation of the laser.

Since this invention deals primarily with the optical waveguide of a laser and the combination of high-gain and low-gain regions within this waveguide, only these two features are illustrated in FIGS. 3–10.

FIG. 3 illustrates the stripe or channel waveguide 31 of a diode laser such as that illustrated in FIG. 2. The active medium of the laser is contained within waveguide 31, and the pumped or high-gain region within the active medium is located under the stippled area 32 on the upper surface of waveguide 31. This high-gain region is typically defined by the geometry of the electrode which is used to pump the active medium. The waveguide 31 can be either an index-guided structure or a gain-guided structure. In an index-guided structure, waveguide 31 is comprised of a core which has a higher index of refraction than that of its surroundings or cladding. In a gain-guided structure, the waveguide 31 is formed when the pumping current flows and induces a higher index of refraction in the pumped region. The refractive index change between the core of the waveguide and its cladding is typically one or two orders of magnitude smaller in a gain-guided structure than it is in an index-guided structure. Nevertheless, a gain-guided waveguide is usually quite satisfactory to confine the light produced by a laser diode.

A channel waveguide such as that illustrated in FIG. 3 will have a thickness 33 and a width 34 which are comparable to the wavelength of the laser light produced, for example, on the order of about one micrometer. When such a waveguide is used, the resulting laser beam is typically that of the fundamental lateral mode. That is to say, there is only one guided wave profile for each optical polarization. The fundamental mode of such a channel waveguide has a single-lobe near-field and far-field pattern, which is the most desirable one for most applications. This fundamental mode is typically Gaussian or Gaussian-like in its intensity profile.

A conventional method for increasing the output power from a diode laser is to use a widened multichannel waveguide as illustrated in FIG. 4. The active medium of the laser is contained within waveguide 41, and the pumped or high-gain region within the active medium is located under the stippled areas 42 on the upper surface of waveguide 41. These high-gain regions or channels are defined by the geometry of the electrodes used to pump the p-n junction of the diode laser. Neighboring channels are spaced at a distance comparable to the output wavelength of the laser or a few multiples of it. As a consequence, all of the channels are optically coupled and locked in phase. The direction of light propagation in waveguide 41 is indicated by the double-headed arrow 43.

A major problem associated with a multichannel waveguide of the type illustrated in FIG. 4 is the irregular pattern of the output beam from the laser in which it is used. This output beam is typically split into two large lobes on which random and irregular fine structure is typically superimposed. This field splitting occurs because the highest order lateral mode has the highest modal gain for lasing action and dominates over other modes. Such an output beam cannot be focused to the single sharp point which is desired for many conventional applications.

We have found that the above-mentioned field splitting can be reduced or eliminated in a widened waveguide if the amount of pumping is made a function of position across the width of the waveguide. This can be conveniently achieved in a diode laser by varying the pumping length along the direction of light propagation as a function of position across the width of the waveguide. For example, FIG. 5 illustrates the high-gain and low-gain regions within a substantially planar waveguide in accordance with one embodiment of this invention. The active medium is contained within waveguide 51 and the high-gain region within the active medium is located under the stippled areas 52 on the upper surface of waveguide 51. The direction of light propagation in waveguide 51 is indicated by the double-headed arrow 54. In a laser diode, the high-gain regions will, of course, be defined by the shape of the electrodes which are used to pump the active medium. The low-gain regions, located under area 53 on the upper surface of waveguide 51, are pumped at some level which is lower than that of the high-gain regions, and if desired, the pumping level in the low-gain regions can be zero.

In the embodiment illustrated by FIG. 5, the cumulative gain from one end of the waveguide to the other along the direction of light propagation has a maximum near the center of the waveguide and a gradual decrease toward the edges of the waveguide when measured as a function of position along a line within the plane of the waveguide which is perpendicular to the direction of light propagation. In this embodiment, the highest pumping level is located approximately halfway across the width 55 of waveguide 51, and modes with relatively high intensity at this halfway point are favored. Accordingly, the fundamental or Gaussian-like mode is favored and the output beam profile will have the highest intensity in the center. Although the invention is not to be so limited, it is believed that the fundamental mode will be most highly favored when the boundary between the high-gain and low-gain regions is a (1-cosine) or parabolic function of position across the width 55 of waveguide 51. Accordingly, such a relationship is preferred.

FIG. 6 illustrates the high-gain and low-gain regions within a substantially planar waveguide in accordance with a preferred embodiment of this invention. The active medium is contained within waveguide 61, and the high-gain regions within the active medium are located under the stippled areas 62 on the upper surface of waveguide 61. The low-gain regions are located under those areas on the upper surface of waveguide 61 which are not stippled, for example, 63. The direction of light propagation in waveguide 61 is indicated by the double-headed arrow 64.

The waveguide of FIG. 6 is identical with that of FIG. 5, except that the low-gain region of FIG. 5 has been replaced by a plurality of alternating stripes of high-replaced gain and low-gain region which are parallel to the direction of light propagation. These stripes serve to prevent undesirable filamentation which might otherwise occur during operation of the laser. Such filamentation, of course, can involve laser action occurring only within a single narrow filament of the active medium while the remainder of the active medium fails to lase. The alternating stripes of high-gain and low-gain region illustrated in FIG. 6 function as a spatial filter that aligns the optical beam along the direction of light propagation. Accordingly, in the event that any filamenting occurs at all, the multiple stripes of high-gain region ensure that laser action will take place in multiple filaments rather than a single filament, thereby maximizing the amount of active medium undergoing laser action. Although the width and spacing of these stripes of high-gain region are not critical, they: (a) have a width which is desirably in the range from about 1 to about 10 $\mu$m and preferably in the range from about 2 to about 6 $\mu$m, and (b) are spaced at a distance from each other which is desirably in the range from about 2 to about 20 $\mu$m and preferably in the range from about 3 to about 10 $\mu$m.

FIG. 7 illustrates the high-gain and low-gain regions within a substantially planar waveguide in accordance with another preferred embodiment of this invention. The active medium is contained within waveguide 71 and the high-gain regions within the active medium are located under the stippled areas 72 on the upper surface of waveguide 71. The low-gain regions are located under that area 73 on the upper surface of waveguide 71 which is not stippled. The direction of light propagation in waveguide 71 is indicated by the double-headed arrow 74.

The waveguide of FIG. 7 is identical with that of FIG. 5 except that one of the high-gain areas of FIG. 5 has been replaced by a plurality of alternating stripes of high-gain and low-gain region which are parallel to the direction of light propagation. As in the waveguide illustrated by FIG. 6, the alternating stripes of high-gain and low-gain region of FIG. 7 function as a spatial filter that aligns the optical beam of the laser along the direction of light propagation. Accordingly, in the event that any filamenting occurs at all, the multiple stripes of high-gain region ensure that laser action will take place in multiple filaments rather than a single filament, thereby maximizing the amount of active medium undergoing laser action. The width and spacing of these stripes of high-gain region are not critical. However, they: (a) have a width which is desirably in the range from about 1 to about 10 $\mu$m and preferably in the range from about 2 to about 6 $\mu$m, and (b) are spaced at a distance from each other which is desirably in the range from about 2 to about 20 $\mu$m and preferably in the range from about 3 to about 10 $\mu$m.

FIG. 8 illustrates the high-gain and low-gain regions within a substantially planar waveuide in accordance with another embodiment of this invention. The active medium is contained within waveguide 81, and the high-gain regions within the active medium are located under the stippled areas 82 on the upper surface of waveguide 81. The low-gain regions are located under area 83 on the upper surface of waveguide 81. The direction of light propagation in waveguide 81 is indicated by double-headed arrow 84.

In the embodiment illustrated by FIG. 8, the cumulative gain from one end of the waveguide to the other along the direction of light propagation has a minimum near the center of the waveguide and a gradual increase toward the edges of the waveguide when measured as a function of position along a line within the plane of the waveguide which is perpendicular to the direction of light propagation. This configuration will result in the production of the highest order mode possible, thereby ensuring the production of an output beam having two widely separated intensity peaks. This output beam will be similar to that obtainable from a conventional multichannel waveguide of the type illustrated in FIG. 4. However, the output beam from the waveguide of FIG. 8 will be more consistently the highest order mode and will not have as much random and irregular fine structure superimposed on it.

FIG. 9 illustrates the high-gain and low-gain regions within a substantially planar waveguide of a further emodiment of this invention. The active medium is contained within waveguide 91, and the high-gain regions within the active medium are located under the stippled gain regions are located under area 93 on the upper surface of waveguide 91. The direction of light propagation is indicated by double-headed arrow 94. This embodiment is essentially the same as that of FIG. 5 except that the cumulative gain (wherein gain is defined as having units of inverse distance) from one end of the waveguide to the other along the direction of light propagation is a linear function of position along a line within the plane of the waveguide which is perpendicular to the direction of light propagation. In the embodiment of FIG. 5, this relationship is nonlinear.

FIG. 10 illustrates the high-gain and low-gain regions within a substantially planar waveguide of a still further embodiment of this invention. The active medium is contained within waveguide 101, and the high-gain regions within the active medium are located under the stippled area 102 on the upper surface of waveguide 101. The low-gain regions within the active medium are located under areas 103 on the upper surface of waveguide 101 which are not stippled. The direction of light propagation in waveguide 101 is indicated by the double-headed arrow 104.

The waveguide of FIG. 10 is substantially identical with that of FIG. 6 except that the low-gain stripes 103 of FIG. 10 are rectangles whereas in FIG. 6 two sides of each low-gain stripe are nonparallel. As in the waveguides illustrated by FIGS. 6 and 7, the alternating stripes of high-gain and low-gain region in FIG. 10 function as a spatial filter that aligns the optical beam of the laser along the direction of light propagation.

In the practice of this invention, the cumulative gain from one end of the optical cavity to the other is varied as a function of position along a line within the plane of the waveguide which is perpendicular to the direction of laser light propagation and wherein this variation is not periodic in an identically repetitive manner. It will be understood, of course, that this variation of cumulative gain can be periodic, but any period measured from peak to peak or trough to trough in the cumulative gain is not repeated in the next period as the width of the waveguide is traversed along the above-mentioned line. For example, the waveguides illustrated by FIGS. 6, 7 and 10 have a periodicity in the cumulative gain because they contain stripes of high-gain and low-gain region. However, the variation in cumulative gain across a given period is not repeated across the next period as the width of the waveguide is traversed.

In one embodiment of this invention, the cumulative gain from one end of the optical cavity to the other is varied from point to adjacent point along a line within the plane of the waveguide which is perpendicular to the direction of light propagation, wherein said points are uniformly spaced along said line and wherein said cumulative gain varies in a nonrepetitive manner from one pair of adjacent points to the next pair of adjacent points along said line. The distance between these adjacent points is desirably not more than 10 $\mu$m, preferably not more than 5 $\mu$m and more preferably not more than 1 $\mu$m.

In a preferred embodiment of the invention, the cumulative gain continuously varies as a function of position along a line within the plane of said waveguide which is perpendicular to the direction of laser light propagation, and FIGS. 5 and 7 through 9 are illustrative of this embodiment. If desired, this continuous variation can be a smooth change across the entire width of the waveguide as illustrated by FIGS. 5, 8 and 9 or, alternatively, the continuous variation can be a smooth change which is interrupted by one or more abrupt changes as illustrated by FIGS. 6 and 7. As illustrated by FIGS. 6, 7 and 10, the cumulative gain can be varied as a step function of position along the above-mentioned line across the width of the waveguide.

For the purposes of the subject invention, the location of the laser mirrors is not critical. With reference to FIGS. 5 through 10, the mirrors can be at the ends of the waveguide or at points along the path of light propagation but located at a distance from these ends. The mirrors can be of any conventional design. However, in diode lasers the mirrors are preferably planar because of the ease of fabrication of such mirrors.

The substantially planar waveguide of this invention can be of any conventional thickness. For example, for a laser diode, the waveguide will have a thickness which is desirably less than about 10 $\mu$m, preferably less than about 5 $\mu$m and more preferably less than about 2 $\mu$m. The width of the waveguide as measured along a line within the plane of the waveguide which is perpendicular to the direction of light propagation in the waveguide is not critical, but in a laser diode will desirably be at least about 10 μm, preferably at least about 50 μm and more preferably at least about 100 μm. The length of the waveguide as measured along the direction of light propagation is not critical and can be of any conventional value.

The waveguide of this invention can be used as a component of any type of conventional laser. As a corollary, any conventional active medium and pumping technique can be used. Suitable pumping techniques include, but are not limited to, optical pumping and the passage of an electric current through a semiconductor diode laser.

A highly preferred embodiment of this invention involves the use of the subject waveguide as a component of a diode laser. Suitable diode lasers include, but are not limited to, those which comprise a simple p-n junction, a heterojunction, and a multiquantum well double heterostructure. The diode laser can be constructed of any conventional semiconductor materials which are suitable for use as the active medium of a laser. The most commonly used semiconductor materials include gallium arsenide (GaAs) and aluminum gallium arsenide alloys ($Al_xGa_{1-x}As$) where the atom ratio of aluminum to gallium can be varied. An aluminum gallium arsenide multiquantum well or superlattice is particularly useful. Accordingly, such semiconductor materials are preferred. However, other suitable semiconductor materials include, but are not limited to, InGaAsP, InAsP, GaAlP, GaAlSb and PbSnTe.

Any conventional waveguide can be used in the practice of this invention so long as it contains the required combinations of high-gain and low-gain regions. For example, in a diode laser, suitable waveguides include both gain-guided and index-guided structures of conventional design. Suitable index-guided structures include, but are not limited to, those which are created by either an impurity profile or a material composition change.

In the practice of this invention, it will be understood that the low-gain regions within the waveguide are pumped at a lower level than the high-gain regions. If desired, the low-gain regions can be unpumped and, accordingly, the gain therein can be zero or substantially zero.

We claim:

1. In a laser comprising an optical cavity which contains an active medium and a substantially planar waveguide to substantially confine the laser light within a plane, wherein said waveguide is comprised of both high-gain and low-gain regions of the active medium, the improvement which comprises a waveguide which is comprised of varying combinations of said high-gain and low-gain regions along the direction of laser light propagation so that the cumulative gain from one end of the optical cavity to the other varies as a function of position along a line within the plane of said waveguide which is perpendicular to said direction of light propagation, wherein said variation is not periodic in an identically repetitive manner, and wherein said variation is effective to cause some of the lateral modes of the optical cavity to experience a relatively higher gain than the rest of the lateral modes of said optical cavity.

2. The laser as set forth in claim 1 wherein said cumulative gain continuously varies as a function of position along said line within the plane of said waveguide.

3. The laser as set forth in claim 1 wherein said cumulative gain varies as a step function of position along said line within the plane of said waveguide.

4. The laser as set forth in claim 1 wherein the gain in said low-gain regions is zero.

5. The laser as set forth in claim 1 wherein said active medium comprises at least one semiconductor material.

6. The laser as set forth in claim 5 wherein said active medium comprises at least one semiconductor material selected from the group consisting of gallium arsenide and aluminum gallium arsenide alloys of the formula $Al_xGa_{1-x}As$.

7. The laser as set forth in claim 6 wherein said active medium is comprised of at least one aluminum gallium arsenide alloy of the formula $Al_xGa_{1-x}As$.

8. The laser as set forth in claim 7 wherein said active medium is a superlattice.

9. The laser as set forth in claim 5 wherein said waveguide is a gain-guided structure.

10. The laser as set forth in claim 5 wherein said waveguide is an index-guided structure.

11. The laser as set forth in claim 10 wherein said index-guided structure is created by an impurity profile.

12. The laser as set forth in claim 10 wherein said index-guided structure is created by a material composition change.

13. The laser as set forth in claim 1 wherein said waveguide is comprised at least in part of a plurality of alternating stripes of high-gain and low-gain region, wherein said stripes are parallel to said direction of light propagation.

14. The laser as set forth in claim 1 wherein said cumulative gain has a maximum near the center of the waveguide and a gradual decrease toward the edges of the waveguide when measured as a function of position along said line within the plane of said waveguide which is perpendicular to said direction of light propagation.

15. The laser as set forth in claim 14 wherein the boundary between the high-gain and low-gain regions is a (1-cosine) function of position along said line which is perpendicular to said direction of light propagation.

16. The laser as set forth in claim 14 wherein the boundary between the high-gain and low-gain regions is a parabolic function of position along said line which is perpendicular to said direction of light propagation.

17. The laser as set forth in claim 1 wherein said cumulative gain has a minimum near the center of the waveguide and a gradual increase toward the edges of the waveguide when measured as a function of position along said line within the plane of said waveguide which is perpendicular to said direction of light propagation.

18. In a laser comprising an optical cavity which contains an active medium and a substantially planar waveguide to substantially confine the laser light within a plane, wherein said waveguide is comprised of both high-gain and low-gain regions of the active medium, the improvement which comprises a waveguide which is comprised of varying combination of said high-gain and low-gain regions along the direction of laser light propagation so that the cumulative gain from one end of the optical cavity to the other varies from point to adjacent point along a line within the plane of said waveguide which is perpendicular to said direction of light propagation, wherein said points are uniformly spaced along said line at a distance not greater than 10 μm, wherein said cumulative gain varies in a nonrepetitive manner from one pair of adjacent points to the next pair of adjacent points along said line, and wherein said variation is effective to cause some of the lateral modes of the optical cavity to experience a relatively higher gain than the rest of the lateral modes of said optical cavity.

19. The laser as set forth in claim 18 wherein said points are uniformly spaced along said line at a distance which is not greater than 1 μm.

20. The laser as set forth in claim 18 wherein said active medium comprises at least one semiconductor material.

* * * * *

UNITED STATES PATENT OFFICE
CERTIFICATE OF CORRECTION

Patent No. 4,791,648          Dated December 13, 1988

Inventor(s) Bruce A. Vojak and Sang K. Sheem

It is certified that error appears in the above-identified patent and that said Letters Patent is hereby corrected as shown below:

Column 2, line 36, "et at." should read --et al.--.

Column 6, line 29, "high-replaced gain" should read --high-gain--.

Column 7, line 17, "waveuide" should read --waveguide--.

Column 7, line 49, "stippled gain regions" should read --stippled areas 92 on the upper surface of waveguide 91. The low-gain regions--.

Signed and Sealed this

Twenty-seventh Day of June, 1989

Attest:

DONALD J. QUIGG

Attesting Officer

Commissioner of Patents and Trademarks